(12) United States Patent
Hong et al.

(10) Patent No.: US 12,130,325 B2
(45) Date of Patent: Oct. 29, 2024

(54) ELECTRONIC DEVICE AND OPERATION METHOD OF ELECTRONIC DEVICE FOR DETECTING CRACK OF SIGNAL LINE

(71) Applicant: Samsung Electronics Co., Ltd., Suwon-si (KR)

(72) Inventors: Myeongjae Hong, Suwon-si (KR); Junwhon Uhm, Suwon-si (KR); Duckjin Kim, Suwon-si (KR); Hyunmo Yang, Suwon-si (KR); Yongseob Yun, Suwon-si (KR); Junmyeong Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 203 days.

(21) Appl. No.: 17/859,589

(22) Filed: Jul. 7, 2022

(65) Prior Publication Data
US 2023/0008917 A1    Jan. 12, 2023

Related U.S. Application Data

(63) Continuation of application No. PCT/KR2022/009530, filed on Jul. 1, 2022.

(30) Foreign Application Priority Data

Jul. 9, 2021    (KR) ........................ 10-2021-0090145

(51) Int. Cl.
*G01R 31/28* (2006.01)
*H05K 1/02* (2006.01)
*H05K 1/14* (2006.01)

(52) U.S. Cl.
CPC ..... *G01R 31/2812* (2013.01); *G01R 31/2813* (2013.01); *H05K 1/0243* (2013.01); *H05K 1/028* (2013.01); *H05K 1/14* (2013.01)

(58) Field of Classification Search
None
See application file for complete search history.

(56) References Cited

U.S. PATENT DOCUMENTS 6,098,027 A    8/2000    Yang
8,947,100 B2    2/2015    Chiu et al.
(Continued)

FOREIGN PATENT DOCUMENTS

CN    212693886 U    3/2021
CN    112640098 A    4/2021
(Continued)

OTHER PUBLICATIONS

International Search Report and Written Opinion dated Oct. 11, 2022, issued in International Application No. PCT/KR2022/009530.

*Primary Examiner* — Farhana A Hoque
(74) *Attorney, Agent, or Firm* — Jefferson IP Law, LLP

(57) ABSTRACT

An electronic device and a method for operating an electronic device are provided. The electronic device includes a first circuit board, a second circuit board, a signal line connecting the first circuit board and the second circuit board, a processor disposed on the first circuit board and outputting a pulse signal through the signal line, a parasitic capacitance pattern disposed around the signal line and generating a parasitic capacitance by the pulse signal, and an amplifier disposed on the second circuit board and amplifying a signal generated by the parasitic capacitance, wherein the processor identifies whether the signal line is abnormal, based on the amplified signal obtained from the amplifier.

23 Claims, 10 Drawing Sheets

(56) References Cited

U.S. PATENT DOCUMENTS

| | | |
|---|---|---|
| 2012/0299602 A1 | 11/2012 | Chiu et al. |
| 2015/0124274 A1 | 5/2015 | Lee et al. |
| 2020/0161493 A1* | 5/2020 | Lee .................... G06F 3/04184 |

FOREIGN PATENT DOCUMENTS

| | | |
|---|---|---|
| JP | 2968964 B1 | 11/1999 |
| JP | 3609687 B2 | 1/2005 |
| JP | 2005-149768 A | 6/2005 |
| KR | 10-0652746 B1 | 12/2006 |
| KR | 20-0451134 Y1 | 11/2010 |
| KR | 10-2012-0131082 A | 12/2012 |
| KR | 10-2002888 B1 | 7/2019 |

* cited by examiner

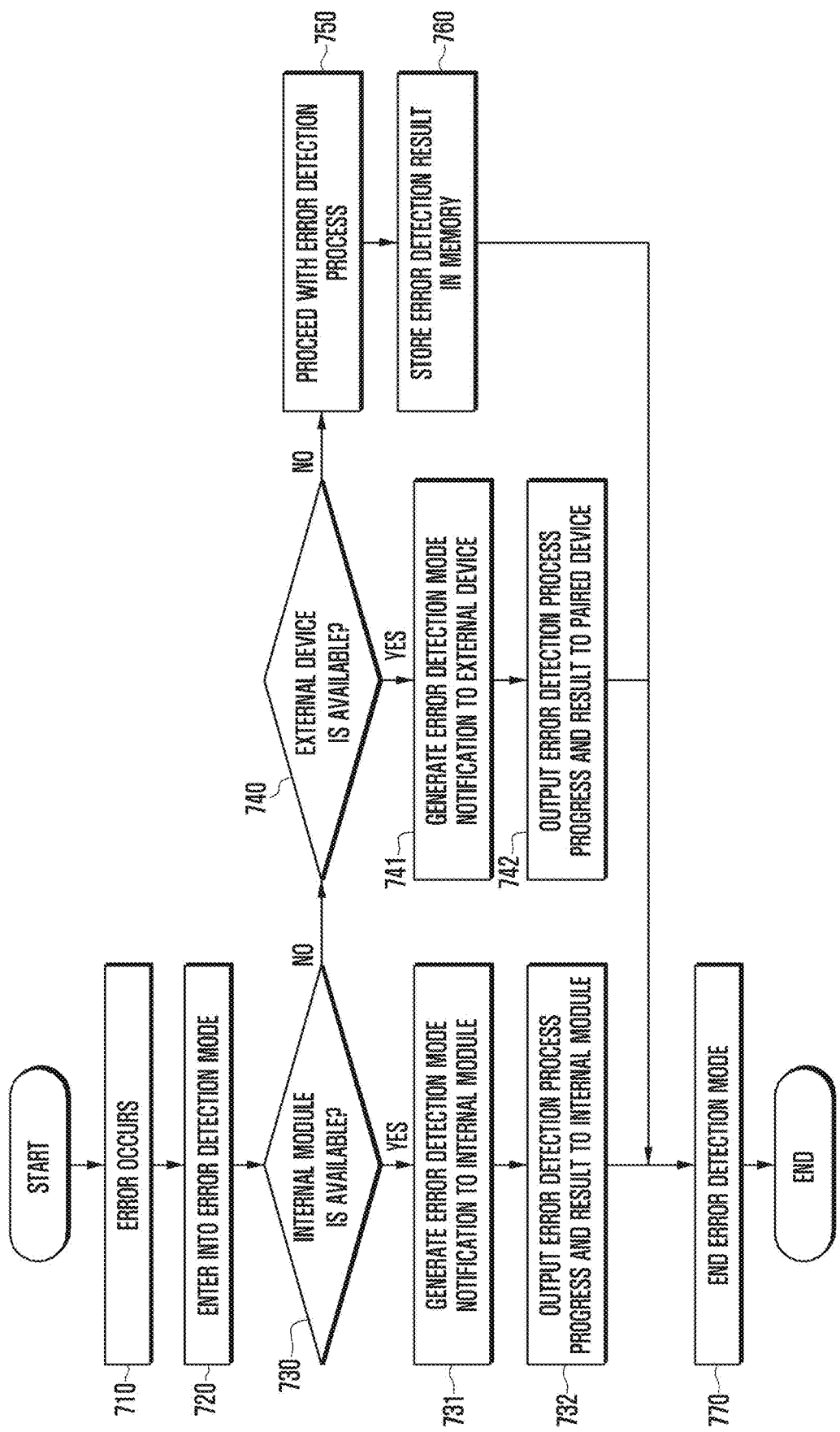

ELECTRONIC DEVICE AND OPERATION METHOD OF ELECTRONIC DEVICE FOR DETECTING CRACK OF SIGNAL LINE

CROSS-REFERENCE TO RELATED APPLICATION(S)

This application is a continuation application, claiming priority under § 365(c), of an International application No. PCT/KR2022/009530, filed on Jul. 1, 2022, which is based on and claims the benefit of a Korean patent application number 10-2021-0090145, filed on Jul. 9, 2021, in the Korean Intellectual Property Office, the disclosure of which is incorporated by reference herein in its entirety.

TECHNICAL FIELD

The disclosure relates to an electronic device for detecting a crack of a signal line, and an electronic device operating method. More particularly, the disclosure relates to an electronic device and an electronic device operating method, wherein when a crack has occurred in a signal line of a circuit board, the signal line with the crack may be identified.

BACKGROUND ART

A flexible printed circuit board (FPCB) is a flexible circuit board which is bendable and thus is commonly used for a hinge part of augmented reality (AR) glass or a folding part of an electronic device, including a folded part of foldable smartphone.

If the FPCB is folded an increased number of times, folding-related fatigue may accumulate in the signal line of the FPCB, and the resistance of the wire may increase. An increased wire resistance of the signal line may cause erroneous communication between integrated circuit (IC) circuits connected to the signal line. For example, if an error occurs in the signal line of the hinge part FPCB of AR glass, operation errors may occur in modules (for example, display, speaker, microphone, camera) connected to the hinge.

The above information is presented as background information only to assist with an understanding of the disclosure. No determination has been made, and no assertion is made, as to whether any of the above might be applicable as prior art with regard to the disclosure.

DISCLOSURE

Technical Problem

The FPCB used for a folding part of an electronic device which can be folded and unfolded (for example, AR glass, foldable smartphone) may have an abnormal signal line as a result of repeated folding operations.

In order to identify whether the signal line is abnormal or not, a detect pin is conventionally added to the FPCB so as to identify whether the detect pin is short-circuited and/or disconnected. However, this approach has a problem in that an abnormality can be identified only when all signal lines included in the FPCB are short-circuited and/or disconnected, and no abnormality can be identified if only some signal lines are short-circuited and/or disconnected.

In addition, in the case of a high-speed signal line for transferring high-speed signals in a printed circuit board (PCB), if a pattern designed to directly analyze signals is directly connected to the signal line to identify whether the same is short-circuited and/or disconnected, the pattern may adversely affect signals transferred by the signal line.

Aspects of the disclosure are to address at least the above-mentioned problems and/or disadvantages and to provide at least the advantages described below. Accordingly, an aspect of the disclosure is to provide an electronic device configured such that, when an abnormality (for example, crack) has occurred in a specific signal line of a FPCB, the signal line with the abnormality may be identified.

It may be a technical problem to be solved by manufacturers to provide a method for accurately identifying in which part of an electronic device an abnormality has occurred, while minimizing influence on signals transmitted by signal lines.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a first circuit board, a second circuit board, a signal line connecting the first circuit board and the second circuit board, a processor disposed on the first circuit board and configured to output a pulse signal through the signal line, a parasitic capacitance pattern disposed around the signal line and configured to generate a parasitic capacitance by the pulse signal, and an amplifier disposed on the second circuit board and configured to amplify a signal generated by the parasitic capacitance, wherein the processor is configured to identify whether the signal line is abnormal, based on the amplified signal obtained from the amplifier.

In accordance with another aspect of the disclosure, a method for operating an electronic device is provided. The method includes outputting a pulse signal through a signal line, obtaining an amplified signal of a signal generated by a parasitic capacitance generated by the pulse signal, and identifying whether the signal line is abnormal based on the amplified signal.

Advantageous Effects

According to an embodiment, an electronic device may identify a signal line abnormality even when an abnormality has occurred in only some of signal lines of an FPCB.

According to another embodiment, an electronic device may identify in which signal line an abnormality has occurred among multiple signal lines of an FPCB.

According to an embodiment, an electronic device may use a method of indirectly analyzing a signal of a signal line in order to identify whether the signal line is abnormal or not, thereby minimizing influence on the signal transmitted through the signal line.

According to another embodiment, an electronic device may have a parasitic capacitance pattern disposed close to a high-speed signal line so as to identify whether the high-speed signal line is abnormal or not without affecting the high-speed signal line.

According to an embodiment, when an abnormality has occurred in an electronic device, information regarding the abnormal part of the electronic device may be provided, thereby providing a rapid repair service to the user.

According to another embodiment, an electronic device may output data at a low data rate in response to an abnormality occurred in a signal line such that the electronic device is controlled to operate normally.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which:

FIG. 7 shows an operation flowchart when an error occurs in a device including an electronic component according to an embodiment of the disclosure;

The same reference numerals are used to represent the same elements throughout the drawings.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
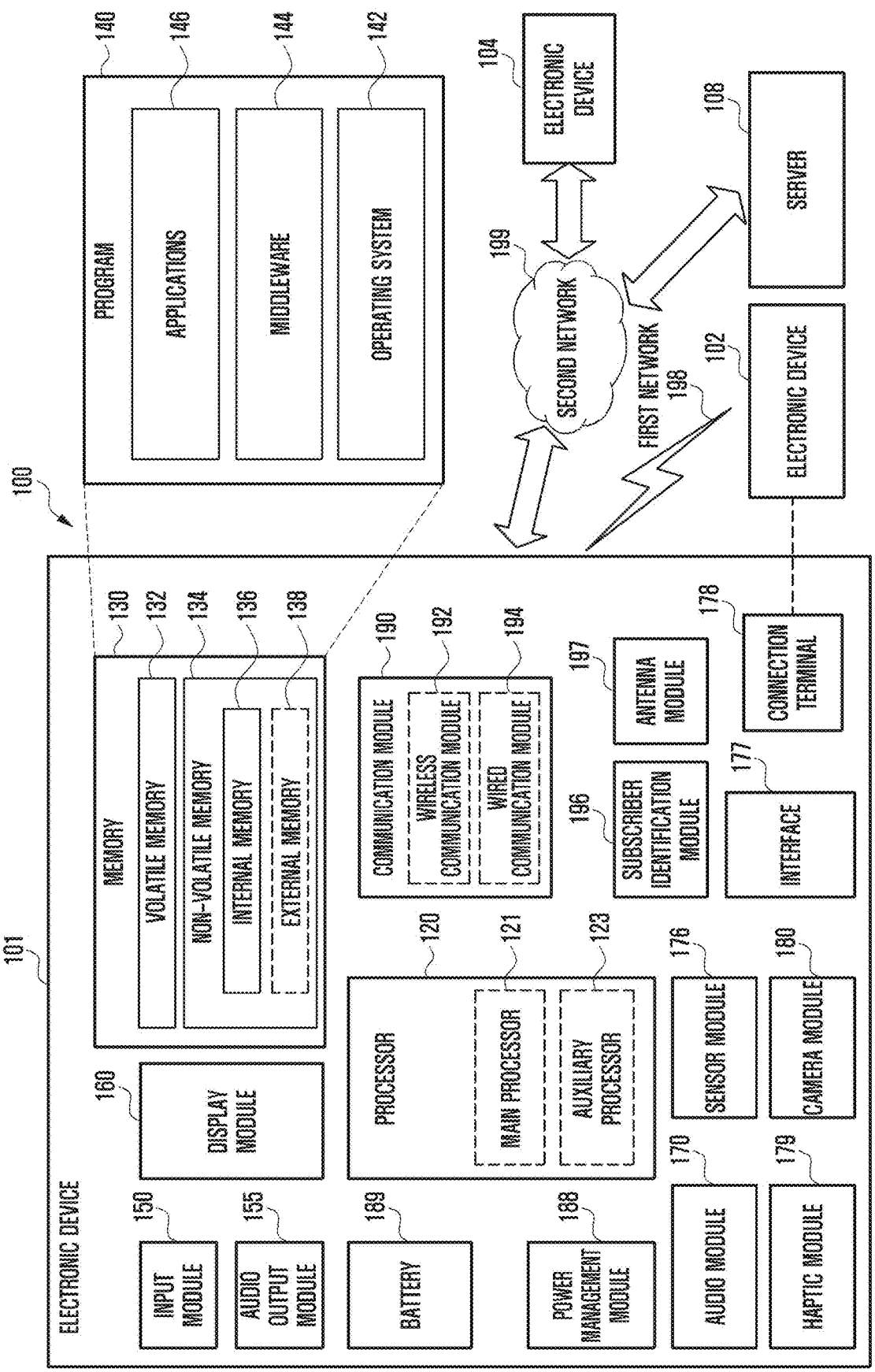
FIG. 1 shows a block diagram illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
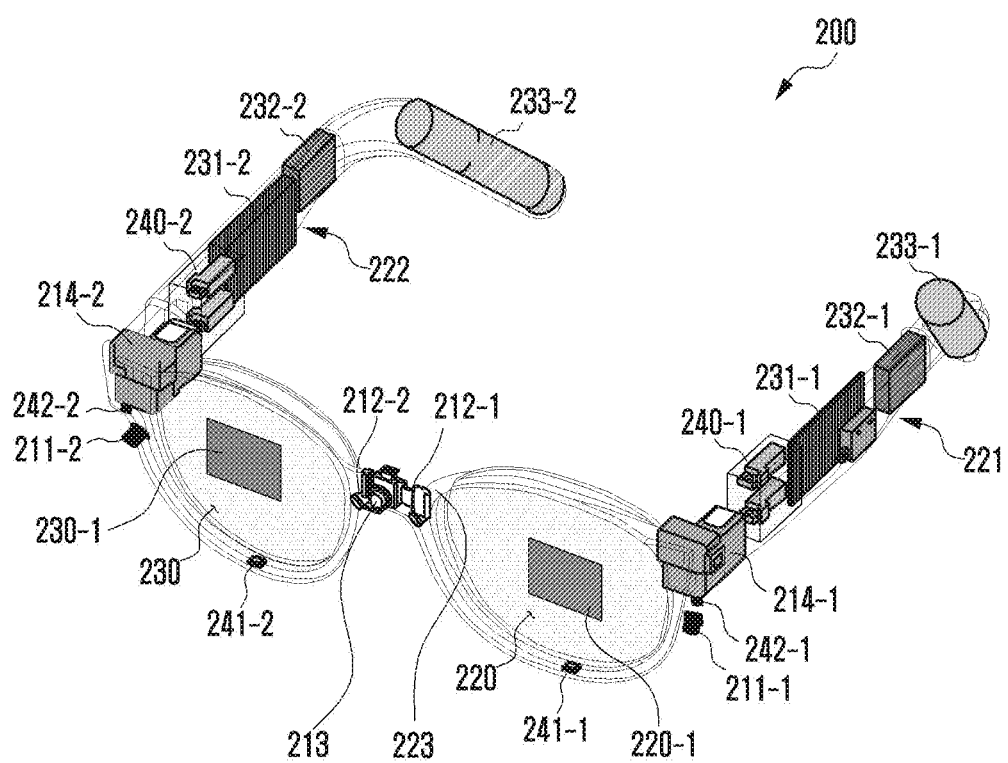
FIG. 2 shows an overall configuration diagram of a device according to an embodiment of the disclosure.

FIG. 2 shows an overall configuration diagram of an electronic device 200 (for example, the electronic device 101 in FIG. 1) according to an embodiment of the disclosure.

In various embodiments, the electronic device 200 may be an electronic device 200 manufactured to be worn on the user's head. For example, the electronic device 200 may be configured as one of glasses, goggles, a helmet, or a hat, but is not limited thereto. According to an embodiment, the electronic device 200 may include multiple transparent members (for example, a first transparent member 220 and/or a second transparent member 230) respectively corresponding to both eyes (for example, a left eye and/or a right eye) of a user.

The electronic device 200 may provide an image related to an augmented reality (AR) service to a user. According to an embodiment, the electronic device 200 may project or display a virtual object on the first transparent member 220 and/or the second transparent member 230 so as to allow at least one virtual object to appear superimposed on the reality perceived by a user through the first transparent member 220 and/or the second transparent member 230 of the electronic device.

Referring to FIG. 2, the electronic device 200 according to an embodiment may include a body 223, a supporter (for example, a first supporter 221 and a second supporter 222), and a hinge (for example, a first hinge 240-1 and a second hinge 240-2).

According to various embodiments, the body 223 and the supporter 221 and 222 may be operatively connected to each other through the hinge 240-1 and 240-2. The body 223 may include a portion formed to be at least partially worn on the nose of a user.

According to various embodiments, the supporter 221 and 222 may include a support member having a shape to be worn on the ear of a user. The support 221 and 222 may include a first supporter 221 to be worn on the left ear and/or a second supporter 222 to be worn on the right ear.

According to various embodiments, the first hinge 240-1 may connect the first supporter 221 and the body 223 to allow the first supporter 221 to rotate with respect to the body 223. The second hinge 240-2 may connect the second supporter 222 and the body 223 to allow the second supporter 222 to rotate with respect to the body 223. According to another embodiment, the hinge 240-1 and 240-2 of the electronic device 200 may be omitted. For example, the body 223 may be directly connected to the supporter 221 and 222.

According to various embodiments, the body 223 may include at least one transparent member (for example, the first transparent member 220 and the second transparent member 230), at least one display module (for example, a first display module 214-1 and a second display module 214-2), at least one camera module (for example, a front photographing camera module 213, an eye tracking camera module (for example, a first eye tracking camera module 212-1 and a second eye tracking camera module 212-2), and a gesture camera module (for example, a first gesture camera module 211-1 and a second gesture camera module 211-2)), and at least one microphone (for example, a first microphone 241-1 and a second microphone 241-2).

In the case of the electronic device 200 illustrated in FIG. 2, light generated by the display module 214-1 and 214-2 may be projected onto the transparent member 220 and 230 to display information. For example, light generated by the first display module 214-1 may be projected onto the first transparent member 220 and light generated by the second display module 214-2 may be projected onto the second transparent member 230. The light capable of displaying a virtual object is projected onto the transparent member 220 and 230 having at least a portion formed of a transparent material so that a user may perceive reality in which the virtual object is superimposed. The display module 160 illustrated in FIG. 1 may be understood to include the display module 214-1 and 214-2 and the transparent member 220 and 230 of the electronic device 200 in FIG. 2. However, the electronic device 200 illustrated in the disclosure is not limited to displaying information in the manner described above. The display module included in the electronic device 200 may be changed to a display module including various types of methods for displaying information. For example, in a case in which a display panel including illumination light-emitting diode (LED) of a transparent material is embedded in the transparent member 220 and 230, information may be displayed without a separate display module (for example, the first display module 214-1 and the second display module 214-2). In the case, the display module 160 illustrated in FIG. 1 may be referred to as the transparent member 220 and 230 and a display panel including the transparent member 220 and 230.

According to various embodiments, the virtual object output through the display module 214-1 and 214-2 may include information related to an application program operated in the electronic device 200 and/or information related to an external object located in the real space perceived through the transparent member 220 and 230 by a user. The external object may include a thing present in the real space. Hereinafter, the real space which a user perceives through the transparent member 220 and 230 will be denoted by a field of view (FoV) area of a user. For example, the electronic device 200 may identify an external object included in at least a portion of an area determined as a field of view (FoV) area of a user from image information related to the real space obtained through a camera module (for example, the photographing camera module 213) of the electronic device 200. The electronic device 200 may output a virtual object related to the identified external object through the display module 214-1 and 214-2.

According to various embodiments, the electronic device 200 may display a virtual object related to a virtual reality service, based on image information related to the real space obtained through the photographing camera module 213 of the electronic device 200. According to various embodiments, the electronic device 200 may display a virtual object based on a display module disposed to correspond to both eyes of a user (for example, the first display module 214-1 corresponding to the left eye and/or the second display module 214-2 corresponding to the right eye). According to an embodiment, the electronic device 200 may display a virtual object based on preconfigured configuration information (for example, resolution, a frame rate, brightness, and/or a display area).

According to various embodiments, the transparent member 220 and 230 may include a condensing lens (not shown) and/or a waveguide (for example, a first waveguide 220-1 and/or a second waveguide 230-1). For example, the first waveguide 220-1 may be partially disposed on the first transparent member 220 and the second waveguide 230-1 may be partially disposed on the second transparent member 230. The light emitted from the display module 214-1 and 214-2 may be incident to one surface of the transparent member 220 and 230. The light incident to the one surface of the transparent member 220 and 230 may be transferred to a user through the waveguide 220-1 and 230-1 disposed inside the transparent member 220 and 230. The waveguide 220-1 and 230-1 may be formed of glass, plastic, or a polymer and include a nanopattern formed on one surface of the inside or the outside thereof. For example, the nanopattern may include a grating structure having a polygonal or curved shape. According to an embodiment, the light incident to one surface of the transparent member 220 and 230 may be transferred to a user by being transmitted and reflected inside the waveguide 220-1 and 230-1 by the nanopattern. According to an embodiment, the waveguide 220-1 and 230-1 may include at least one of a diffraction element (for example, a diffractive optical element (DOE) and a holographic optical element (HOE)) or a reflection element (for example, a reflective mirror). According to an embodiment, the waveguide 220-1 and 230-1 may guide the light emitted from the display module 214-1 and 214-2 to a user by using the at least one diffraction element or a reflection element.

According to various embodiments, the electronic device 200 may include a photographing camera module 213 (for example, an RGB camera module) for photographing an image corresponding to a field of view (FoV) of a user and/or measuring a distance from an object, an eye tracking camera module 212-1 and 212-2 for identifying a direction of user's gaze, and/or a gesture camera module 211-1 and 211-2 for recognizing a predetermined space. For example, the photographing camera module 213 may photograph the front direction of the electronic device 200 and the eye tracking camera 212-1 and 212-2 may photograph a direction opposite to the photographing direction of the photographing camera module 213. For example, the first eye tracking camera module 212-1 may partially photograph the left eye of a user and the second eye tracking camera module 212-2 may partially photograph the right eye of a user. According to an embodiment, the photographing camera module 213 may include a high-resolution camera module such as a high-resolution (HR) camera module and/or a photo video (PV) camera module. According to an embodiment, the eye tracking camera module 212-1 and 212-2 may detect a user's eye and track a gaze direction. The tracked gaze direction may be used for the center of a virtual image including a virtual object to move according to the gaze direction. According to an embodiment, the gesture camera module 211-1 and 211-2 may detect a user gesture within a preconfigured distance (for example, a predetermined space) and/or a predetermined space. The gesture camera module 211-1 and 211-2 may include a camera module including a global shutter (GS). For example, the gesture camera module 211-1 and 211-2 may be a camera module including a GS capable of reducing a rolling shutter phenomenon in order to detect and track rapid hand movements and/or fine movements of fingers.

According to various embodiments, the electronic device 200 may detect an eye corresponding to a dominant eye and/or non-dominant eye among a left and/or a right eye by using at least one camera module 211-1, 211-2, 212-1, 212-2, and 213. For example, the electronic device 200 may detect an eye corresponding to a dominant eye and/or non-dominant eye, based on a gaze direction of a user with respect to an external object or a virtual object.

The number or location of the at least one camera module (for example, the photographing camera module 213, the eye tracking camera module 212-1 and 212-2, and/or the gesture camera module 211-1 and 211-2) included in the electronic device 200 illustrated in FIG. 2 may be not limited. For example, the number or location of the at least one camera module (for example, the photographing camera module 213, the eye tracking camera module 212-1 and 212-2, and/or the gesture camera module 211-1 and 211-2) may be variously changed based on a form (for example, a shape or size) of the electronic device 200.

According to various embodiments, the electronic device 200 may include at least one illumination LED (for example, the first illumination LED 242-1 and a second illumination LED 242-2) in order to increase accuracy of the at least one camera module (for example, the photographing camera module 213, the eye tracking camera module 212-1 and 212-2, and/or the gesture camera module 211-1 and 211-2). For example, the first illumination LED 242-1 may be disposed to correspond to the user's left eye and the second illumination LED 242-2 may be disposed to correspond to the user's right eye. In an embodiment, the illumination LED 242-1 and 242-2 may be used as an assistance element for increasing accuracy when the user's eye is photographed using the eye tracking camera module 212-1 and 212-2 and may include an IR LED generating light of infrared wavelengths. In addition, the illumination LED 242-1 and 242-2 may be used as an assistance element when it is not easy to detect a subject to be photographed due to a dark environment or mixing of various light sources and reflected light when photographing a user by using the gesture camera module 211-1 and 211-2.

According to various embodiments, the electronic device 200 may include a microphone (for example, a first microphone 241-1 and a second microphone 241-2) for receiving a user's voice and an ambient sound. For example, the microphone 241-1 and 241-2 may be a component included in the audio module 170 in FIG. 1.

According to various embodiments, the first supporter 221 and/or the second supporter 222 may include a printed circuit board (PCB) (for example, a first printed circuit board 231-1 and a second printed circuit board 231-2), a speaker (for example, a first speaker 232-1 and a second speaker 232-2), and/or a battery (for example, a first battery 233-1 and a second battery 233-2).

According to various embodiments, the speaker 232-1 and 232-2 may include the first speaker 232-1 for transferring an audio signal to the left ear of a user and the second speaker 232-2 for transferring an audio signal to the right ear of a user. For example, the speaker 232-1 and 232-2 may be a component included in the audio module 170 in FIG. 1.

According to various embodiments, multiple batteries 233-1 and 233-2 may be included in the electronic device 200 and supply power to the printed circuit board 231-1 and 231-2 through a power management module (for example, the power management module 188 in FIG. 1). For example, the multiple batteries 233-1 and 233-2 may be electrically connected to the power management module (for example, the power management module 188 in FIG. 1).

Although the electronic device 200 is described as a device for displaying augmented reality above, the electronic device 200 may be a device for displaying virtual reality (VR). The transparent member 220 and 230 may be formed of an opaque material so that a user may not perceive a real space through the transparent member 220 and 230. In addition, the transparent member 220 and 230 may function as a display module 160. For example, the transparent member 220 and 230 may include a display panel for displaying information.

The electronic device illustrated in FIG. 2 may be an embodiment of an electronic device including an electronic component 300, and the electronic device according to various embodiments is not limited to the electronic device 200 illustrated in FIG. 2 and may be an electronic device including the electronic component 300 and having various forms.

Figure 3:
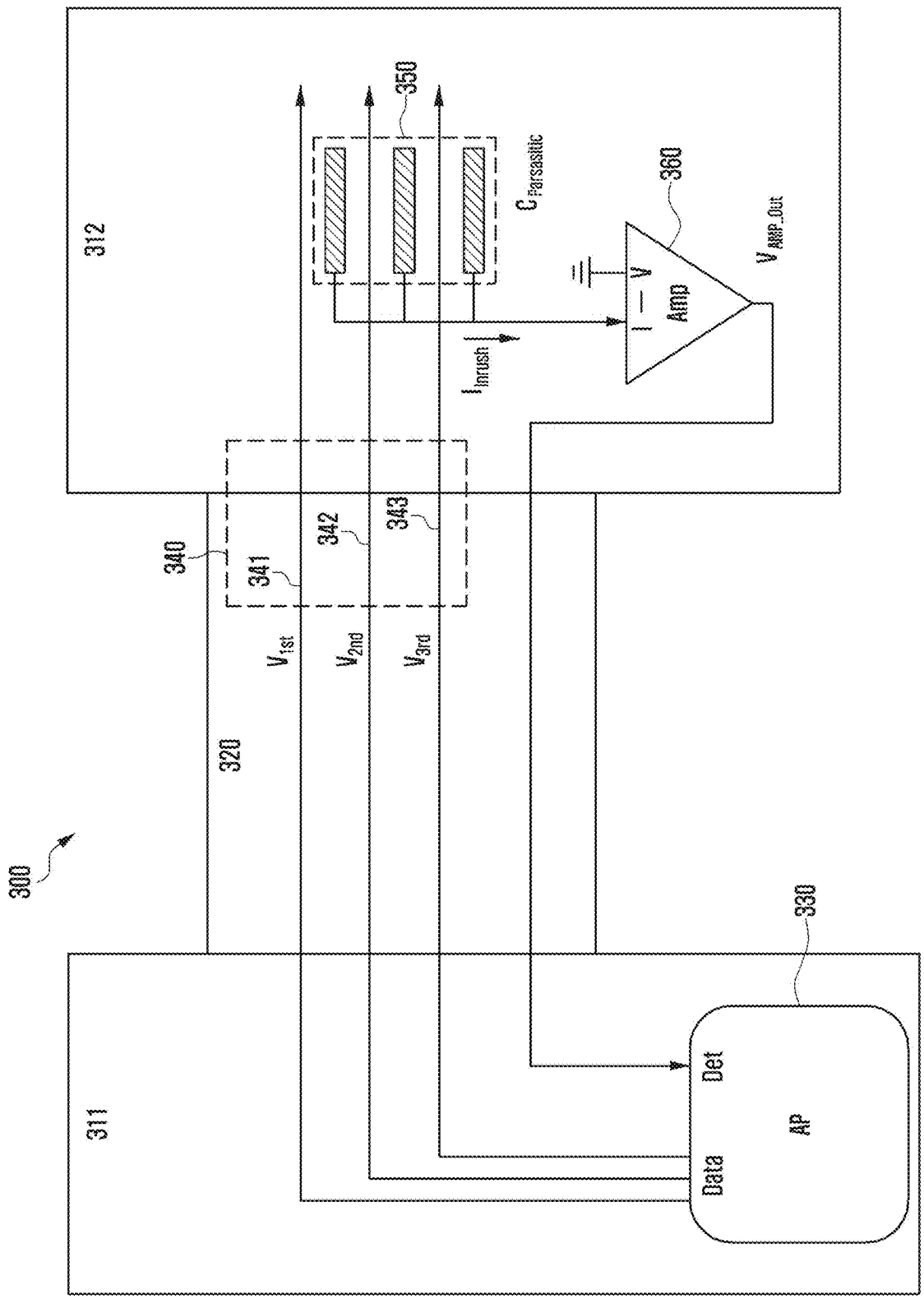
FIG. 3 shows a circuit diagram of an electronic component according to an embodiment of the disclosure.

FIG. 3 is a circuit diagram of an electronic component 300 according to an embodiment of the disclosure.

Referring to FIG. 3, the electronic component 300 may include a first circuit board 311, a second circuit board 312, a flexible circuit board 320, a processor 330, multiple signal lines 340, a parasitic capacitance pattern 350, and/or an amplifier 360. The components included in FIG. 3 may show a portion of configurations included in the electronic component 300 and the electronic component 300 may include various components in addition thereto.

The first circuit board 311 according to various embodiments may be a printed circuit board (PCB) including the processor 330 and the second circuit board 312 may be a circuit board including the amplifier 360. The first circuit board 311 and/or the second circuit board 312 according to an embodiment may be a circuit board including at least one layer (for example, a multi-layer).

The flexible circuit board 320 according to various embodiments may be a flexible printed circuit board (FPCB) interposed between the first circuit board 311 and the second circuit board 312 and including multiple signal lines 340. For example, the flexible circuit board 320 may have flexibility and is disposed on a curved or bent area of the electronic component 300 so as to function to connect other circuit board (for example, the first circuit board 311 and/or the second circuit board 312).

The processor 330 according to various embodiments may be disposed on the first circuit board 311 and transmit or receive a signal and/or data to/from a component included in the second circuit board 312 through the signal line 340.

According to an embodiment, the processor 330 may output a pulse signal to each of the signal line 340 in an error detection mode for identifying whether a crack has occurred on the signal line 340. For example, the processor 330 may output a pulse voltage having a designated magnitude.

According to another embodiment, in order to identify which signal line is cracked, the processor 330 may output pulse signals to a first signal line 341, a second signal line 342, and/or a third signal line 343 with time difference. For example, the processor 330 may output a pulse signal to the signal line 340 in the manner of outputting a first pulse signal to the first signal line 341, then outputting a second pulse signal to the second signal line 342 after a designated time has elapsed, and then outputting a third pulse signal to the third signal line 343 after a designated time has elapsed.

According to various embodiments, the processor 330 may identify whether the signal line 340 is abnormal, based on an amplified signal obtained from the amplifier 360. For example, the processor 330 may identify that a crack has occurred on the signal line 340, in response to the amplified signal being less than a designated voltage. For example, the processor 330 may identify whether the amplified signal is less than a designated voltage by using a threshold voltage and/or an analog-to-digital converter (ADC).

According to various embodiments, the processor 330 may identify whether a crack has occurred on the signal line, based on an amplified signal obtained from the amplifier 360. For example, the processor 330 may obtain an amplified signal corresponding to each pulse signal from the amplifier 360 in response to outputting pulse signals to a first signal line 341, a second signal line 342, and/or a third signal line 343 with time difference. For example, the processor 330 may obtain, from the amplifier 360, a first amplified signal corresponding to the first pulse signal, a second amplified signal corresponding to the second pulse signal, and a third amplified signal corresponding to the third pulse signal.

According to an embodiment, the processor 330 may identify that a crack has occurred on a signal line corresponding to an amplified signal less than a designated voltage among amplified signals. For example, in response to the third amplified signal corresponding to the third pulse signal output to the third signal line 343 being less than a designated voltage, the processor 330 may identify that a crack has occurred on the third signal line 343.

The signal line 340 according to various embodiments may be wired on the first circuit board 311, the flexible circuit board 320, and second circuit board 312 to connect the configuration of the first circuit board 311 and the configuration of the second circuit board 312.

According to an embodiment, the signal line 340 may be connected to the processor 330 disposed on the first circuit board 311 so as to transfer a signal and/or data output from the processor 330 to the configuration of the second circuit board 311.

According to another embodiment, the signal line 340 may include at least one of the first signal line 341, a second signal line 342, or the third signal line 343.

The parasitic capacitance pattern 350 according to various embodiments may be disposed around the signal line 340 to form a parasitic capacitance and connected to the amplifier 360 to transfer a current generated by the parasitic capacitance to the amplifier 360.

According to yet another embodiment, the parasitic capacitance pattern 350 may be disposed around the signal line 340 to form a parasitic capacitance by a current flowing through the signal line 340. For example, when a current flows through the signal line 340, a parasitic capacitance $C_{Parasitic}$ may be generated by a space between the signal line 340 and the parasitic capacitance pattern 350, and accordingly, an inrush current $I_{Inrush}$ may flow. For example, the parasitic capacitance pattern 350 may disposed around each of the first signal line 341, the second signal line 342, and the third signal line 343, and parasitic capacitances $C_{Parasitic}$ may be formed by each of the first pulse signal $V_{1st}$ of the first signal line 341, the second pulse signal $V_{2nd}$ of the second signal line 342, and the third pulse signal $V_{3rd}$ of the third signal line 343.

According to an embodiment, the parasitic capacitance pattern 350 disposed around each of the first signal line 341, the second signal line 342, and the third signal line 343 may form one node. For example, when the processor 330 outputs the $V_{1st}$ pulse signal to the first signal line 341, the $V_{2nd}$ pulse signal to the second signal line 342, and the $V_{3rd}$ pulse signal to the third signal line 343 with time difference, an inrush current $I_{Inrush}$ corresponding to a time at which the pulse signal is output may flow in the parasitic capacitance pattern 350. A detailed description related to the parasitic capacitance and the inrush current incurred by the signal line 340 and the parasitic capacitance pattern 350 will be given below in a description related to FIG. 6.

According to an embodiment, the parasitic capacitance pattern 350 may be disposed on a layer different from a layer of a circuit board in which the signal line 340 is included. According to another embodiment, the parasitic capacitance pattern 350 may be disposed on a layer identical to a layer of a circuit board in which the signal line 340 is included. A detailed description related to the disposition of the parasitic capacitance pattern 350 will be given below in a description related to FIG. 6.

According to another embodiment, the parasitic capacitance pattern 350 may be disposed on the second circuit board 312 and around the signal line 340. According to another embodiment, the parasitic capacitance pattern 350 may be disposed on the flexible circuit board 320 and around the signal line 340.

The amplifier 360 according to various embodiments may be disposed on the second circuit board 312, amplify a signal obtained from the parasitic capacitance pattern 350, and be connected to the processor 330 so as to output the amplified signal to the processor 330.

According to yet another embodiment, the amplifier 360 may convert an input current into a voltage, and amplify and output the same. For example, the amplifier 360 may convert an inrush current $I_{Inrush}$ obtained from the parasitic capacitance pattern 350 into a voltage and amplify the same to output an amplified signal $V_{AMPout}$.

Figure 4:
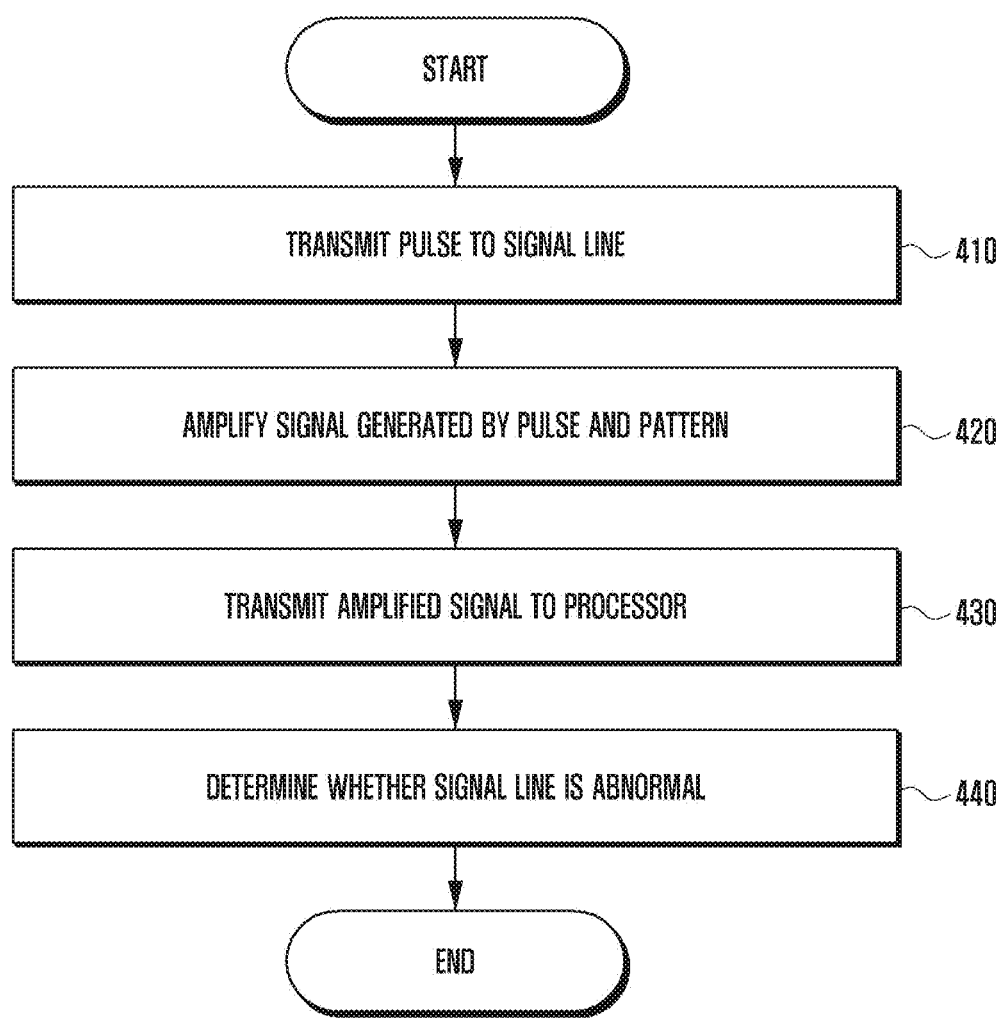
FIG. 4 shows a flowchart illustrating a method of an electronic component to identify an abnormality in a signal line according to an embodiment of the disclosure.

FIG. 4 shows a flowchart illustrating a method of an electronic component (for example, the electronic component 300 in FIG. 3) to identify an abnormality in a signal line (for example, the signal line 340 in FIG. 3) according to an embodiment of the disclosure.

Referring to FIG. 4, a processor (for example, the processor 330 in FIG. 3) according to various embodiments may output a pulse signal to the signal line 340 in operation 410.

According to an embodiment, the processor 330 may be disposed on a first circuit board (for example, the first circuit board 311 in FIG. 3) and connected to multiple signal lines 340 connecting the first circuit board 311 and a second circuit board (for example, the second circuit board 312 in FIG. 3) so as to receive or transmit a signal from or to a configuration included in the second circuit board 312. For example, the processor 330 may output a pulse signal to a configuration included the second circuit board 312 through the signal line 340.

According to another embodiment, the processor 330 may output a voltage pulse signal to the signal line 340.

According to yet another embodiment, the processor 330 may output a predetermined voltage pulse to the signal line 340 with time difference. For example, the processor 330 may output a pulse signal to the signal line 340 in the manner of outputting a pulse signal to a first signal line (for example, the first signal line 341 in FIG. 3), then outputting a pulse signal to a second signal line (for example, the second signal line 342 in FIG. 3) after a designated time has elapsed, and then outputting a pulse signal to a third signal line (for example, the third signal line 343 in FIG. 3) after a designated time has elapsed.

An amplifier (for example, the amplifier 360 in FIG. 3) according to various embodiments may amplify a signal generated by a pulse signal and a parasitic capacitance pattern (for example, the parasitic capacitance pattern 350 in FIG. 3) in operation 420.

The parasitic capacitance pattern 350 according to an embodiment may be disposed around the signal line 340 to form a parasitic capacitance and connected to the amplifier 360 to transfer a current generated by the parasitic capacitance to the amplifier 360.

According to an embodiment, the parasitic capacitance pattern 350 may be disposed around the signal line 340 to form a parasitic capacitance by a current flowing through the signal line 340. For example, when a current flows through the signal line 340, a parasitic capacitance $C_{Parasitic}$ may be generated by a space between the signal line 340 and the parasitic capacitance pattern 350, and accordingly, an inrush current $I_{Inrush}$ may flow. For example, the parasitic capacitance pattern 350 may be disposed around each of the first signal line 341, the second signal line 342, and the third signal line 343, and parasitic capacitances $C_{Parasitic}$) may be formed by each of the first pulse signal $V_{1st}$ of the first signal line 341, the second pulse signal $V_{2nd}$ of the second signal line 342, and the third pulse signal $V_{3rd}$ of the third signal line 343.

According to an embodiment, the amplifier 360 may obtain a current generated by the parasitic capacitance, convert the current into a voltage, and amplify and output the same. For example, the amplifier 360 may convert an inrush current $I_{Inrush}$ obtained from the parasitic capacitance pattern 350 into a voltage and amplify the same to output an amplified signal $V_{AMPout}$.

The amplifier 360 according to various embodiments may output the amplified signal to the processor 330 in operation 430.

The amplifier 360 according to an embodiment may be connected to the processor 330 to output an amplified signal $V_{AMPout}$ to the processor 330.

The processor 330 according to various embodiments may identify whether the signal line 340 is abnormal in operation 440.

According to another embodiment, the processor 330 may identify whether the signal line 340 is abnormal, based on an amplified signal obtained from the amplifier 360. For example, the processor 330 may identify that a crack has occurred on the signal line 340, in response to the amplified signal being less than a designated voltage. For example, the processor 330 may identify whether the amplified signal is less than a designated voltage by using a threshold voltage and/or an analog-to-digital converter (ADC).

According to yet another embodiment, the processor 330 may identify which signal line is cracked, based on an amplified signal obtained from the amplifier 360. For example, the processor 330 may obtain an amplified signal corresponding to each pulse signal from the amplifier 360 in response to outputting pulse signals to a first signal line 341, a second signal line 342, and/or a third signal line 343 with time difference. For example, the processor 330 may obtain a first amplified signal corresponding to the first pulse signal, a second amplified signal corresponding to the second pulse signal, and a third amplified signal corresponding to the third pulse signal.

According to an embodiment, the processor 330 may identify that a crack has occurred on a signal line corresponding to an amplified signal less than a designated voltage among amplified signals. For example, in response to the third amplified signal corresponding to the third pulse signal output to the third signal line 343 being less than a designated voltage, the processor 330 may identify that a crack has occurred on the third signal line 343.

Figure 5A:
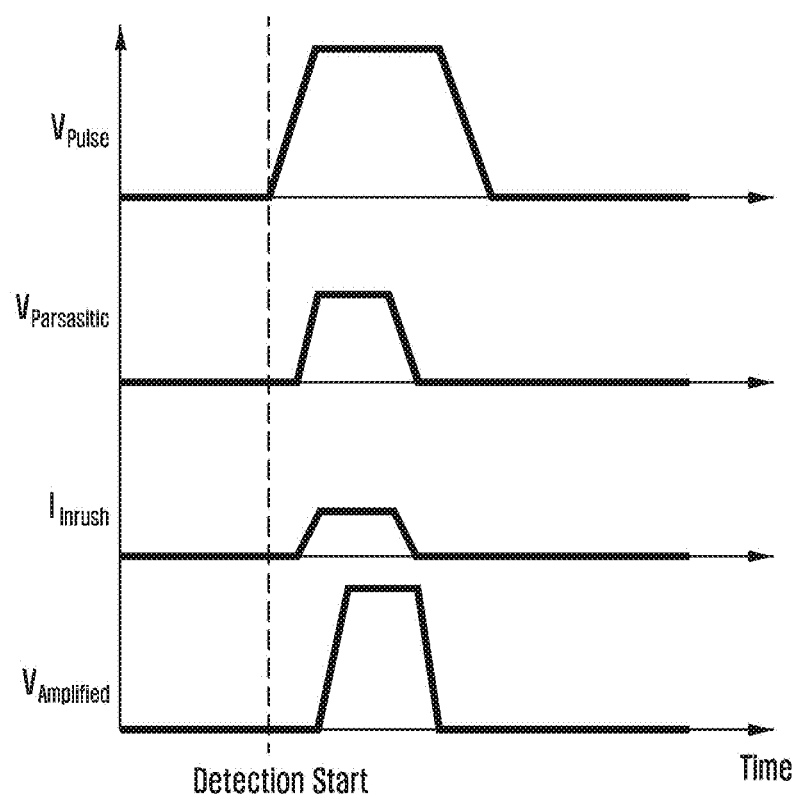
FIGS. 5A and 5B show graphs of a signal generatable by a portion of the electronic component in FIG. 3 according to various embodiments of the disclosure.

FIG. 5A shows a graph of a signal generatable by a portion of the electronic component 300 in FIG. 3 according to an embodiment of the disclosure.

$V_{Pulse}$ may be a voltage pulse signal output to a signal line (for example, the signal line 340 in FIG. 3) in a mode for a processor (for example, the processor 330 in FIG. 3) to identify whether a crack has occurred on the signal line 340. For example, the processor 330 may output, in an error detection mode, a voltage pulse $V_{Pulse}$) having a designated magnitude to the signal line 340 to identify whether an error has occurred thereon.

$V_{Parasitic}$ may be a voltage by a parasitic capacitance generated on a parasitic capacitance pattern (for example, the parasitic capacitance pattern 350 in FIG. 3) by a pulse signal $V_{Pulse}$. For example, when a pulse signal $V_{Pulse}$ is output to the signal line 340 to cause a current to flow, a parasitic capacitance $C_{Parasitic}$ may be generated by a space between the signal line 340 and the parasitic capacitance pattern 350 disposed around the signal line 340 and a parasitic voltage $V_{Parasitic}$ may be generated on the parasitic capacitance pattern 350 by the parasitic capacitance $C_{Parasitic}$.

$I_{Inrush}$ may be an inrush current caused to flow by the parasitic current $V_{Parasitic}$. For example, an inrush current $I_{Inrush}$ may flow around the parasitic capacitance pattern 350 according to a parasitic voltage $V_{Parasitic}$ generated on the parasitic capacitance pattern 350.

$V_{Amplified}$ may be signal generated by an amplifier (for example, the amplifier 360 in FIG. 3) converting an inrush current $I_{Inrush}$ into a voltage and amplifying the same. For example, the amplifier 360 may convert an inrush current $I_{Inrush}$ obtained from the parasitic capacitance pattern 350 into a voltage and amplify the same to output an amplified signal $V_{AMPout}$. For example, the amplifier 360 may output the amplified signal $V_{AMPout}$ to the processor 330.

Accordingly, in a state in which the signal line 340 is normal, when the processor 330 outputs the pulse signal $V_{Pulse}$) to the signal line 340, the processor 330 may obtain an amplified signal $V_{AMPout}$ having a voltage larger than or equal to a designated voltage from the amplifier 360.

$V_{Pulse}$, $V_{Parasitic}$, $I_{Inrush}$ and $V_{Amplified}$ may be signals generated with time difference according to a circuit environment such as a configuration around a line, a length of a line, and/or a characteristic of a line.

Figure 5B:
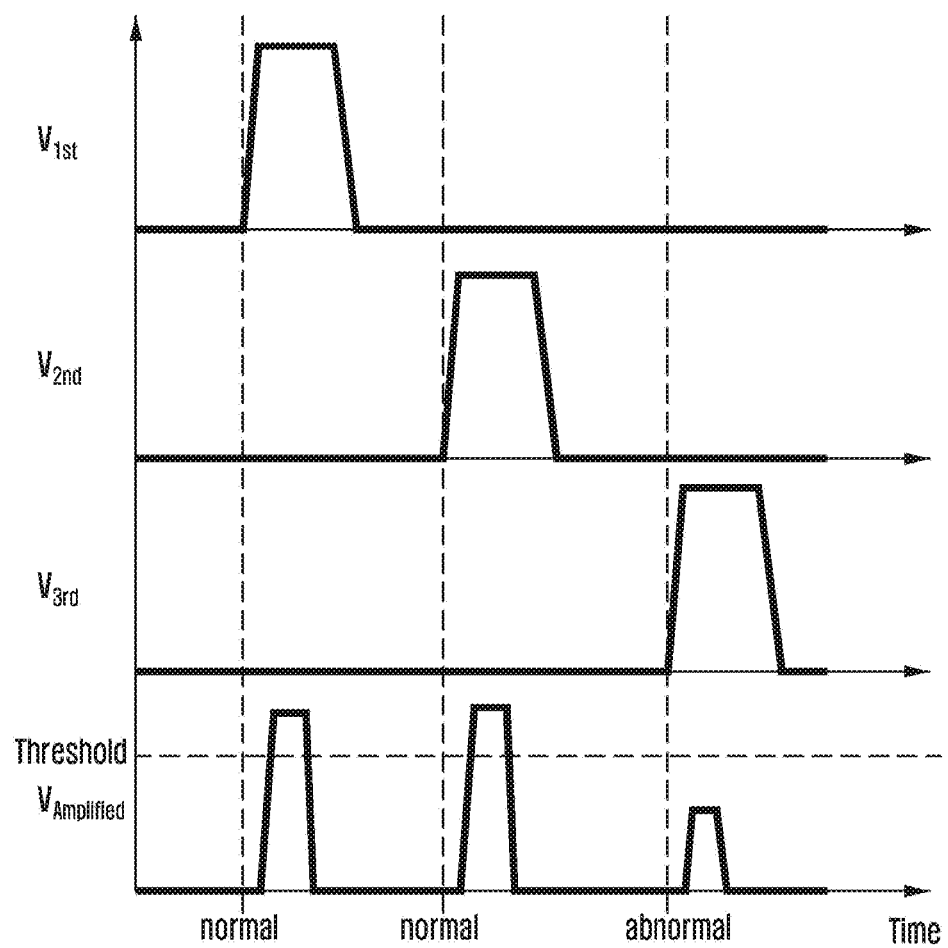

FIG. 5B shows a graph of a signal generatable by a portion of the electronic component 300 such as FIG. 3 according to an embodiment of the disclosure.

$V_{1st}$, $V_{2nd}$, and $V_{3rd}$ may be pulse signals output from the processor 330 to the first signal line 341, the second signal line 342, and the third signal line 343, respectively.

According to an embodiment, the processor 330 may output a predetermined voltage pulse to the multiple signal lines 340 with time difference. For example, the processor 330 may output a voltage pulse in a manner of outputting a $V_{1st}$ pulse signal to the first signal line 341, then outputting a $V_{2nd}$ pulse signal to the second signal line 342 after a designated time has elapsed, and then outputting a $V_{3rd}$ pulse signal to the third signal line 343 after a designated time has elapsed.

$V_{Amplified}$ may be an amplified signal obtained by the processor 330 from the amplifier 360.

According to another embodiment, the processor 330 may which signal line is cracked, based on an amplified signal obtained from the amplifier 360. For example, the processor 330 may obtain an amplified signal $V_{Amplified}$) corresponding to each pulse signals from the amplifier 360 in response to outputting pulse signals $V_{1st}$, $V_{2nd}$, and $V_{3rd}$ to the first signal line 341, the second signal line 342, and/or the third signal line 343 with time difference.

According to an embodiment, the processor 330 may identify that a crack has occurred on a signal line corresponding to an amplified signal less than a designated voltage (threshold) among amplified signals $V_{Amplified}$). For example, in response to the amplified signal $V_{Amplified}$) corresponding to the pulse signal $V_{3rd}$)0|| output to the third signal line 343 being less than a designated voltage (threshold), the processor 330 may identify that a crack (abnormality) has occurred on the third signal line 343.

According to another embodiment, the first signal line 341, the second signal line 342, and the third signal line 343 may be signal lines having different characteristics such as transferring different signals. For example, even when the processor 330 outputs the same pulse signal to the first signal line 341, the second signal line 342, and the third signal line 343, different parasitic voltages $V_{Parasitic}$ are generated depending on the characteristics of the first signal line 341, the second signal line 342, and the third signal line 343 and thus different amplified signals $V_{Parasitic}$) may be obtained.

According to an embodiment, the processor 330 may designate a designated voltage (threshold) for each signal line and identify whether a crack has occurred on a signal line. For example, the processor 330 may identify that a crack has occurred on each signal line when among amplified signals $V_{Amplified}$ obtained by amplifying pulse signals output to each signal line, an amplified signal corresponding to a $V_{1st}$ pulse signal is less than a first voltage (for example, threshold 1), an amplified signal corresponding to a $V_{2nd}$ pulse signal is less than a second voltage (for example, threshold 2), and an amplified signal corresponding to a $V_{3rd}$ pulse signal is less than a third voltage (for example, threshold 3).

Figure 6:
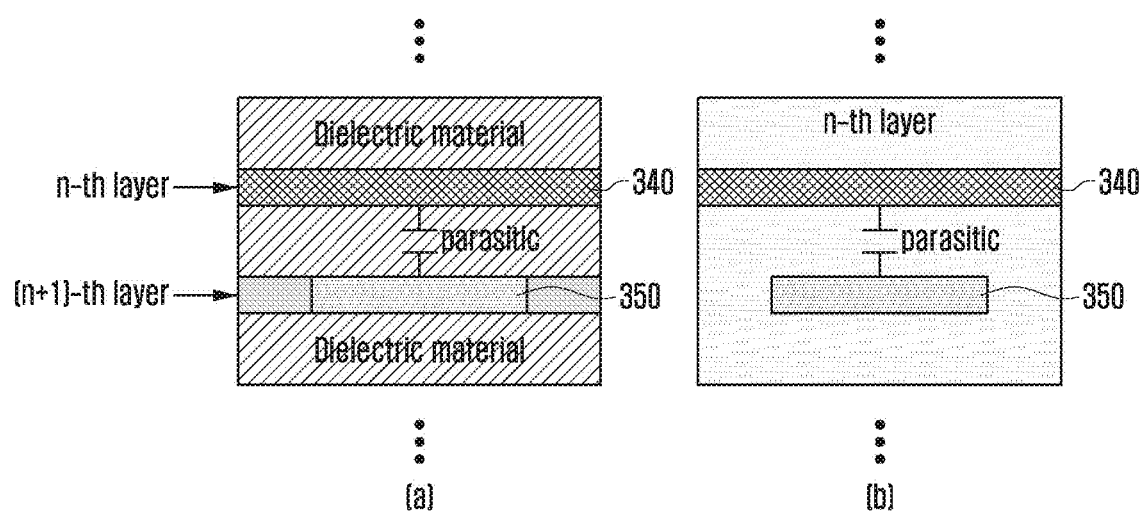
FIG. 6 shows a view illustrating an arrangement of parasitic capacitance pattern according to an embodiment of the disclosure.

FIG. 6 shows a view illustrating an arrangement of parasitic capacitance pattern (for example, the parasitic capacitance pattern 350 in FIG. 3) according to an embodiment of the disclosure.

Referring to part (a) of FIG. 6, a signal line (for example, the signal line 340 in FIG. 3) and a parasitic capacitance pattern 350 may be disposed on different layers of a circuit board (2-layer sensing). For example, the parasitic capacitance pattern 350 may be disposed on an upper layer (n−1th layer) or a lower layer (n+1th layer) of a layer (n-th layer) on which the signal line 340 is disposed and a parasitic capacitance may be formed by a current flowing through the signal line 340. For example, when a current flows through the signal line 340, a parasitic capacitance $C_{Parasitic}$ may be generated by a layer space (dielectric material) between the signal line 340 and the parasitic capacitance pattern 350.

Referring to part (b) of FIG. 6, the signal line 340 and the parasitic capacitance pattern 350 may be disposed on the same layer of a circuit board (1-layer sensing). For example, the parasitic capacitance pattern 350 may be disposed on a layer (n-th layer) the same as a layer (n-th layer) on which the signal line 340 is disposed and a parasitic capacitance may be formed by a current flowing through the signal line 340. For example, when a current flows through the signal line 340, a parasitic capacitance $C_{Parasitic}$ may be generated by a space in which lines are disconnected between the signal line 340 and the parasitic capacitance pattern 350.

FIG. 7 shows an operation flowchart of a device (for example, the electronic device 200 in FIG. 2) when an error occurs in the electronic device 200 including an electronic component (for example, the electronic component 300 in FIG. 3) according to an embodiment of the disclosure.

Referring to FIG. 7, according to various embodiments, the electronic device 200 may identify that an error has occurred in operation 710. For example, the electronic device 200 may identify that an error has occurred when a signal displayed on a display is abnormal, a screen photographed by a camera is abnormal, or a communication module is incapable of detecting a signal.

According to various embodiments, the electronic device 200 may enter into an error detection mode in operation 720. According to an embodiment, the electronic device 200 may enter into the error detection mode, based on a user's request or a periodic operation.

According to an embodiment, the error detection mode may be a mode for causing the electronic device 200 to switch active states of each module so as to detect a module having an error having occurred in the electronic device 200. For example, the error detection mode may be a state for causing all functions other than function required for the operation to be inactivated. For example, the error detection mode may be a mode in which all signals other than a signal required for a detection operation are turned off and switched to a state in which noise is minimized. For example, the error detection mode may include a state in which the electronic device 200 is not operated and received in a case.

According to another embodiment, the entering into the error detection mode is optional and the error detection process may proceed without entering into the error detection mode.

According to various embodiments, the electronic device 200 may identify whether an internal module (i.e., internal interface) is available in operation 730. For example, the electronic device 200 may identify whether an output module (for example, a display and/or a speaker) of the electronic device 200 is in an available state.

According to various embodiments, in operation 731, the electronic device 200 may generate an error detection mode notification to the internal module in response to the identifying that the internal module is available (i.e., operation 730—Yes). For example, the electronic device 200 may generate a notification (for example, "An error is detected and the device enters into the error detection mode.") of entering into the error detection mode to the output module (for example, a display and/or a speaker)

According to various embodiments, the electronic device 200 may proceed with the error detection process and output a detection result to the internal module in operation 732.

According to an embodiment, the electronic device 200 may proceed with the error detection process on each electronic component 300 expected to have an error having occurred thereon by using the method of the flowchart shown in FIG. 4.

According to another embodiment, the electronic device 200 may output a result (for example, "An error has occurred on LINE 3 of a right hinge part of AR glasses") for the electronic component 300 that has been identified as having an error to the output module (for example, a display and/or a speaker).

According to various embodiments, in operation 740, the electronic device 200 may identify whether an external device is available in response to the identifying that the internal module is not available (i.e., operation 730-No).

According to an embodiment, the electronic device 200 may identify whether a paired and available external device (for example, a smartphone) exists.

According to various embodiments, in operation 741, the electronic device 200 may generate an error detection module notification to the external device in response to the identifying that the external device is available (i.e., operation 740—Yes).

For example, the electronic device 200 may generate a notification of entering into the error detection mode (for example, "An error is detected and the device enters into the error detection mode.") to the external device (for example, a smartphone).

According to various embodiments, the electronic device 200 may proceed with the error detection process and output a detection result to the external device in operation 742.

According to an embodiment, the electronic device 200 may proceed with the error detection process on each electronic component 300 expected to have an error having occurred thereon by using the method of the flowchart shown in FIG. 4.

According to another embodiment, the electronic device 200 may output a result (for example, "An error has occurred on LINE 3 of a right hinge part of AR glasses") for the electronic component 300 that has been identified as having an error to the external device (for example, a smartphone).

According to various embodiments, in operation 750, the electronic device 200 may proceed with the error detection process in response to the identifying that the external device is not available (i.e., operation 740-No).

According to an embodiment, the electronic device 200 may proceed with the error detection process on each electronic component 300 expected to have an error having occurred thereon by using the method of the flowchart shown in FIG. 4.

According to various embodiments, the electronic device 200 may store an error detection result in the memory in operation 760.

According to an embodiment, the electronic device 200 may store a result for the electronic component 300 that has been identified as having an error in the memory.

According to various embodiments, the electronic device 200 may end the error detection mode in operation 770.

Figure 8A:
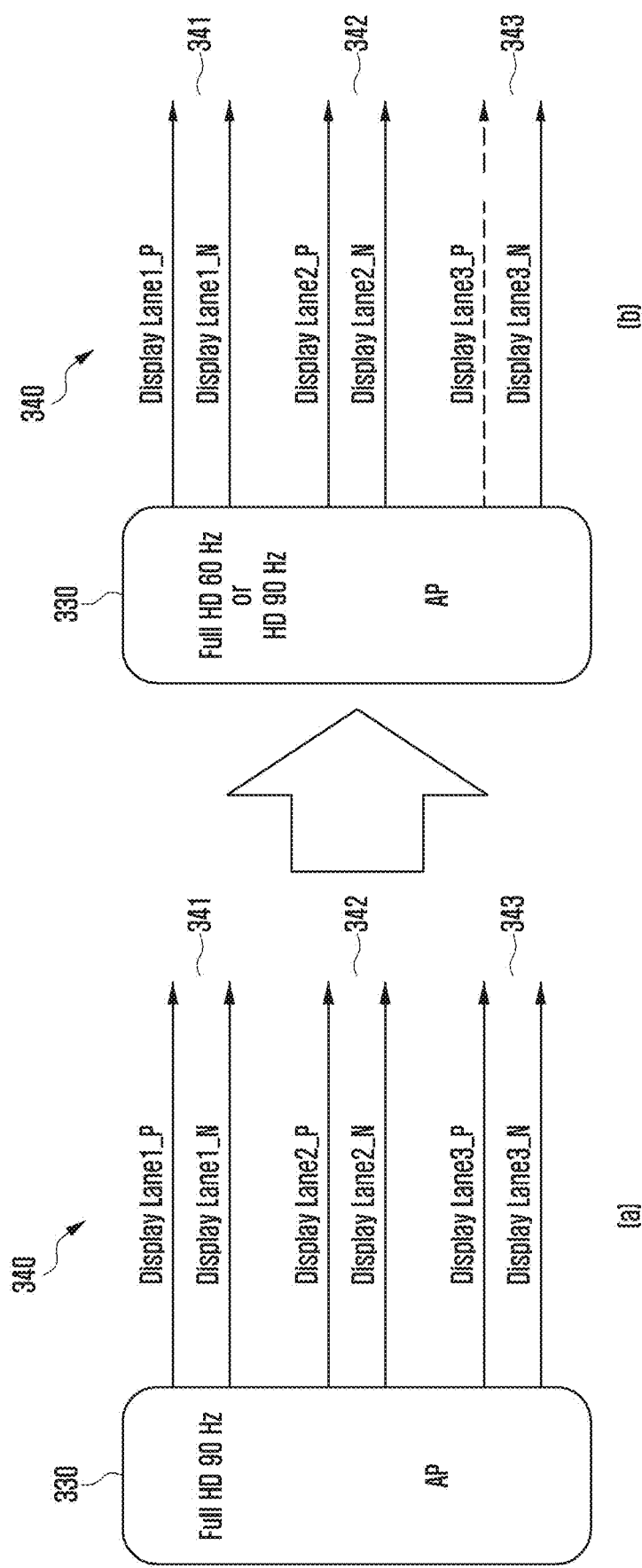
FIG. 8A shows a view illustrating an example of an electronic component related to a mode for changing output data when a crack has occurred in a signal line according to an embodiment of the disclosure.

FIG. 8A shows a view illustrating an example of a portion of the electronic component 300 related to a mode for changing output data when a crack has occurred on the signal line 340 according to an embodiment of the disclosure.

For example, assuming that the maximum data rate output from the processor 330 to each signal line is 30 bps (bits per second), when all the signal lines normally operate, the processor 330 may output data at the total data rate of 90 bps.

Referring to part (a) of FIG. 8A, the processor 330 may output a first mode signal in response to normal connection of all the first signal line 341, the second signal line 342, and the third signal line 343.

According to an embodiment, the first mode may be a mode in which the processor 330 outputs data that may be output at the possible maximum output data rate (for example, 90 bps).

For example, the processor 330 may output display data of first mode (for example, Full HD resolution, 90 Hz scan rate) in response to the electronic device having the electronic component 300 outputting data to the display module. For example, the processor 330 may output display data of first mode (for example, Full HD resolution, 90 Hz scan rate) in response to the electronic device having the electronic component 300 outputting a signal to the tracking camera module. For example, the processor 330 may output camera data of first mode (for example, high-definition photographing) in response to the electronic device having the electronic component 300 outputting data to the photographing camera module.

In other words, the processor 330 may output first mode data requiring a data rate of about 75 bps to the signal line 340 within 90 bps, the maximum data rate.

Referring to part (b) of FIG. 8A, the processor 330 may output a second mode signal in response to at least one of the first signal line 341, the second signal line 342, and the third signal line 343 having a crack having been incurred thereon.

For example, the processor 330 may output data to the signal line at the maximum data rate of 60 bps because only the first signal line 341 and the second signal line 342 are available.

According to an embodiment, the second mode may be a mode in which the processor 330 outputs data that may be output at a possible output data rate (for example, 60 bps).

For example, the processor 330 may output display data of second mode (for example, Full HD resolution, 60 Hz scan rate or HD resolution, 90 Hz scan rate) in response to the electronic device having the electronic component 300 outputting data to the display module. For example, the processor 330 may output display data of second mode (for example, Full HD resolution, 60 Hz scan rate or HD resolution, 90 Hz scan rate) in response to the electronic device having the electronic component 300 outputting data to the tracking camera module. For example, the processor 330 may output camera data of second mode (for example, low-definition photographing) in response to the electronic device having the electronic component 300 outputting data to the photographing camera module. In other words, the processor 330 may output second mode data requiring a data rate of about 50 bps within 60 bps, the maximum data rate.

Figure 8B:
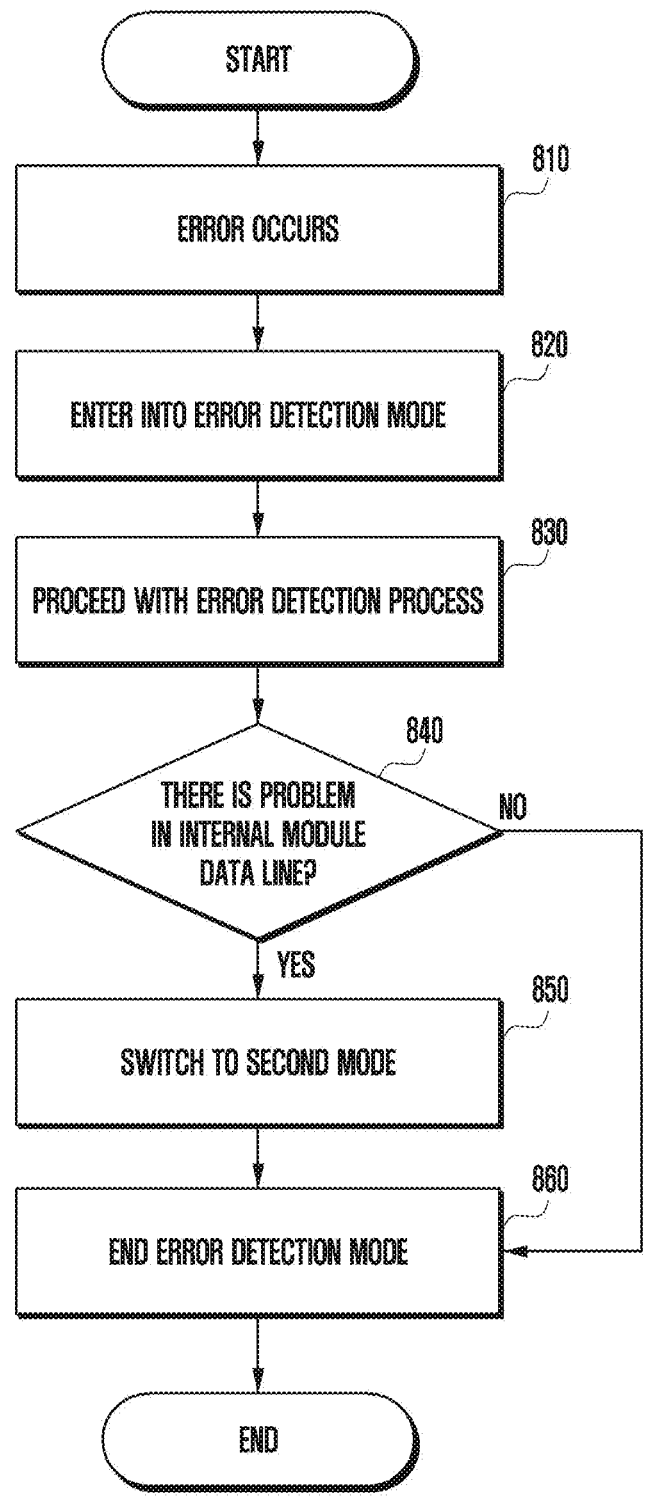
FIG. 8B shows an operation flowchart when an error occurs in a device including an electronic component such as that of FIG. 8A according to an embodiment of the disclosure.

FIG. 8B shows an operation flowchart when an error occurs in the electronic device 200 including the electronic component 300 such as that of FIG. 8A according to an embodiment of the disclosure.

Referring to FIG. 8B, according to various embodiments, the electronic device 200 may identify that an error has occurred in operation 810. For example, the error of the electronic device 200 may include cases that a signal displayed on a display is abnormal, a screen photographed by a camera is abnormal, or a communication module is incapable of detecting a signal.

According to various embodiments, the electronic device 200 may enter into an error detection mode in operation 820.

According to an embodiment, the error detection mode may be a mode for causing the electronic device 200 to switch active states of each module so as to detect a module having an error having occurred in the electronic device 200. For example, the error detection mode may be a state for causing all functions other than function required for the operation to be inactivated. For example, the error detection mode may be a mode in which all signals other than a signal required for a detection operation are turned off and switched to a state in which noise is minimized. For example, the error detection mode may include a state in which the electronic device 200 is not operated and received in a case.

According to another embodiment, the entering into the error detection mode is optional and the error detection process may proceed without entering into the error detection mode.

According to various embodiments, the electronic device 200 may proceed with the error detection process in operation 830.

According to an embodiment, the electronic device 200 may proceed with the error detection process on each electronic component 300 expected to have an error having occurred thereon by using the method of the flowchart shown in FIG. 4.

According to various embodiments, the electronic device 200 may identify whether a problem has occurred in an internal module data line in operation 840.

According to an embodiment, the electronic device 200 may identify whether a problem has occurred in the signal line of the internal module according to operation 440 in FIG. 4. For example, the electronic device 200 may identify whether a crack has occurred on a portion of signal lines of the electronic component 300 of the internal module.

According to various embodiments, the electronic device 200 may be switched to the second mode in operation 850 in response to a problem having occurred in the signal line of the internal module (i.e., operation 840—Yes).

According to an embodiment, the second mode may be a mode in which the processor 330 outputs data that may be output at an available output data.

According to various embodiments, the electronic device 200 may end the error detection mode in operation 860 (i.e., operation 840—No).

According to various embodiments of the disclosure, an electronic device (for example, the electronic device 101 in FIG. 1 or the electronic device 200 in FIG. 2) may include a first circuit board 311, a second circuit board 312, a signal line connecting the first circuit board 311 and the second circuit board 312, a processor 330 disposed on the first circuit board 311 and outputting a pulse signal through the signal line, a parasitic capacitance pattern 350 disposed around the signal line and generating a parasitic capacitance by the pulse signal, and an amplifier 360 disposed on the second circuit board 312 and amplifying a signal generated by the parasitic capacitance, wherein the processor 330 identifies whether the signal line is abnormal, based on the amplified signal obtained from the amplifier 360.

In the electronic device according to various embodiments of the disclosure, the parasitic capacitance pattern 350 may form the parasitic capacitance in a space between the signal line and the parasitic capacitance pattern 350 in response to the pulse signal being transmitted through the signal line, and the amplifier 360 may obtain an inrush current generated by the parasitic capacitance, amplify the inrush current, and output the amplified signal to the processor 330.

In the electronic device according to various embodiments of the disclosure, the processor 330 may identify that the signal line is abnormal in response to the amplified signal being less than a designated value.

In the electronic device according to various embodiments of the disclosure, the signal line may include a first signal line 341 and a second signal line 342, the processor 330 may output a first pulse signal to the first signal line 341 and a second pulse signal to the second signal line 342 with a designated time interval, obtain, from the amplifier 360, a first amplified signal corresponding to the first pulse signal and a second amplified signal corresponding to the second pulse signal, and identify an abnormal signal line among the signal lines based on the obtained amplified signal.

In the electronic device according to various embodiments of the disclosure, the processor 330 may identify an amplified signal being less than a designated value among the amplified signals, and identify that the second signal line 342 corresponding to the second amplified signal is abnormal in response to the second amplified signal being less than a designated value.

In the electronic device according to various embodiments of the disclosure, the parasitic capacitance pattern 350 may be disposed on the second circuit board 312.

The electronic device according to various embodiments of the disclosure may further include a flexible circuit board connecting the first circuit board 311 and the second circuit board 312, and the parasitic capacitance pattern 350 may be disposed on the flexible circuit board.

In the electronic device according to various embodiments of the disclosure, the processor 330 may switch, in response to the identifying that an error has occurred in the electronic device, the electronic device into an error detection mode in which at least a portion of functions other than the function for identifying the error is inactivated.

In the electronic device according to various embodiments of the disclosure, the processor 330 may operate, when outputting data, in a first mode for outputting high-capacity data and a second mode for outputting low-capacity data and operate in the second mode in response to the identifying that the signal line is abnormal.

The electronic device according to various embodiments of the disclosure may further include a display module, and in response to the processor 330 outputting data to the display module, the first mode may be a mode for outputting data corresponding to a high-resolution and high scan rate and the second mode may be a mode for outputting data corresponding to a low-resolution and low scan rate.

A method for operating an electronic device according to various embodiments of the disclosure may include an operation of outputting a pulse signal through a signal line, an operation of obtaining an amplified signal of a signal generated by a parasitic capacitance generated by the pulse signal, and an operation of identifying whether the signal line is abnormal based on the amplified signal.

The method for operating an electronic device according to various embodiments of the disclosure may include an operation of identifying that the signal line is abnormal in response to the amplified signal being less than a designated value.

The method for operating an electronic device according to various embodiments of the disclosure may include an operation of outputting a first pulse signal to the first signal line 341 and a second pulse signal to the second signal line 342 with a designated time interval, an operation of obtaining a first amplified signal corresponding to the first pulse signal and a second amplified signal corresponding to the second pulse signal, and an operation of identifying an abnormal signal line among the signal lines, based on the obtained amplified signal.

The method for operating an electronic device according to various embodiments of the disclosure may include an operation of identifying an amplified signal being less than a designated value among the amplified signals, and an operation of identifying that the second signal line 342 corresponding to the second amplified signal is abnormal in response to the second amplified signal being less than a designated value.

The method for operating an electronic device according to various embodiments of the disclosure may include an operation of switching, in response to the identifying that an error has occurred in the electronic device, the electronic device into an error detection mode in which at least a portion of functions other than the function for identifying the error is inactivated.

The method for operating an electronic device according to various embodiments of the disclosure may include an operation of identifying whether an internal module including an output function is available, an operation of displaying notification of entering into an error detection mode of the electronic device on the internal module in response to the availability of the internal module, and an operation of displaying an error detection result of the electronic device on the internal module.

The method for operating an electronic device according to various embodiments of the disclosure may include an operation of identifying whether a connected external electronic device is available, an operation of displaying notification of entering into an error detection mode of the electronic device on the external electronic device in response to the availability of the external electronic device, and an operation of displaying an error detection result of the electronic device on the external electronic device.

In the method for operating an electronic device according to various embodiments of the disclosure, the electronic device may operate, when outputting data, in a first mode for outputting high-capacity data and a second mode for outputting low-capacity data and operate in the second mode in response to the identifying that the signal line is abnormal.

In the method for operating an electronic device according to various embodiments of the disclosure, in response to outputting data to a display module, the first mode may be a mode for outputting data corresponding to a high-resolution and high scan rate and the second mode may be a mode for outputting data corresponding to a low-resolution and low scan rate.

In the method for operating an electronic device according to various embodiments of the disclosure, in response to outputting data to a camera module, the first mode may be a mode for outputting data corresponding to high-definition photographing and the second mode may be a mode for outputting data corresponding to a low-definition photographing.

The various embodiments disclosed herein, and the terms used therein are not intended to limit the technical features described herein to specific embodiments, and should be understood to include various modifications, equivalents, or substitutions of the embodiments.

In connection with the description of the drawings, similar reference numerals may be used for similar or related elements. The singular form of the noun corresponding to the item may include one or more of the items, unless the relevant context clearly dictates otherwise.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a first circuit board;
   a second circuit board;
   a signal line connecting the first circuit board and the second circuit board;
   a processor disposed on the first circuit board and configured to output a pulse signal through the signal line;
   a parasitic capacitance pattern disposed around the signal line and configured to generate a parasitic capacitance by the pulse signal; and
   an amplifier disposed on the second circuit board and configured to amplify a signal generated by the parasitic capacitance,
   wherein the processor is configured to identify whether the signal line is abnormal, based on the amplified signal obtained from the amplifier.

2. The electronic device of claim 1,
   wherein the parasitic capacitance pattern is further configured to form the parasitic capacitance in a space between the signal line and the parasitic capacitance pattern in response to the pulse signal being transmitted through the signal line, and
   wherein the amplifier is further configured to:
      obtain an inrush current generated by the parasitic capacitance,
      amplify the inrush current, and
      output the amplified signal to the processor.

3. The electronic device of claim 1, wherein the processor is further configured to:
   identify that the signal line is abnormal in response to the amplified signal being less than a designated value.

4. The electronic device of claim 1,
   wherein the signal line comprises a first signal line and a second signal line, and
   wherein the processor is further configured to:
      output a first pulse signal to the first signal line and a second pulse signal to the second signal line with a designated time interval,
      obtain, from the amplifier, a first amplified signal corresponding to the first pulse signal and a second amplified signal corresponding to the second pulse signal, and
      identify an abnormal signal line among the signal lines based on the obtained amplified signal.

5. The electronic device of claim 4, wherein the processor is further configured to:
   identify an amplified signal less than a designated value among the amplified signals, and
   identify that the second signal line corresponding to the second amplified signal is abnormal in response to the second amplified signal being less than a designated value.

6. The electronic device of claim 1, wherein the parasitic capacitance pattern is disposed on the second circuit board.

7. The electronic device of claim 1, further comprising:
   a flexible circuit board configured to connect the first circuit board and the second circuit board,
   wherein the parasitic capacitance pattern is disposed on the flexible circuit board.

8. The electronic device of claim 1, wherein the processor is further configured to:
   in response to the identifying that an error has occurred in the electronic device, switch the electronic device into an error detection mode in which at least a portion of functions other than the function for identifying the error is inactivated.

9. The electronic device of claim 1, wherein the processor is further configured to:
   operate, when outputting data, in a first mode for outputting high-capacity data or a second mode for outputting low-capacity data; and
   in response to the identifying that the signal line is abnormal, operate in the second mode.

10. The electronic device of claim 9, further comprising:
    a display module,
    wherein, in response to the processor outputting data to the display module, the first mode is a mode for outputting data corresponding to a high-resolution and high scan rate, and
    wherein the second mode is a mode for outputting data corresponding to a low-resolution and low scan rate.

11. A method for operating an electronic device, the method comprising:

outputting a pulse signal through a signal line of the electronic device;

obtaining a signal generated by parasitic capacitance caused by a parasitic capacitance pattern disposed around the signal line due to the pulse signal being output;

amplifying the signal generated by the parasitic capacitance; and identifying whether the signal line is abnormal based on the amplified signal.

12. The method of claim 11, further comprising:

identifying that the signal line is abnormal in response to the amplified signal being less than a designated value.

13. The method of claim 11, further comprising:

outputting a first pulse signal to a first signal line and a second pulse signal to a second signal line with a designated time interval;

obtaining a first amplified signal corresponding to the first pulse signal and a second amplified signal corresponding to the second pulse signal; and identifying an abnormal signal line among the signal lines, based on the obtained amplified signal.

14. The method of claim 13, further comprising identifying an amplified signal less than a designated value among the amplified signals; and identifying that the second signal line corresponding to the second amplified signal is abnormal in response to the second amplified signal being less than a designated value.

15. The method of claim 11, further comprising:

switching, in response to the identifying that an error has occurred in the electronic device, the electronic device into an error detection mode in which at least a portion of functions other than the function for identifying the error is inactivated.

16. The method of claim 11, further comprising:

identifying whether an internal interface comprising an output function is available;

in response to the availability of the internal interface, displaying notification of entering into an error detection mode of the electronic device on the internal interface; and displaying an error detection result of the electronic device on the internal interface.

17. The method of claim 11, further comprising:

identifying whether a connected external electronic device is available;

in response to the availability of the external electronic device, displaying notification of entering into an error detection mode of the electronic device on the external electronic device; and displaying an error detection result of the electronic device on the external electronic device.

18. The method of claim 11, further comprising:

operating the electronic device, when outputting data, in a first mode for outputting high-capacity data and a second mode for outputting low-capacity data; and operating the electronic device in the second mode in response to the identifying that the signal line is abnormal.

19. The method of claim 18, wherein, in response to outputting data to a display module, the first mode is a mode for outputting data corresponding to a high-resolution and high scan rate, and wherein the second mode is a mode for outputting data corresponding to a low-resolution and low scan rate.

20. The method of claim 18, wherein, in response to outputting data to a camera module, the first mode is a mode for outputting data corresponding to high-definition photographing, and wherein the second mode is a mode for outputting data corresponding to low-definition photographing.

21. The method of claim 11, wherein the parasitic capacitance is based on a current flowing through the signal line.

22. The method of claim 11, wherein the signal line includes a first signal line, a second signal line, and a third signal line.

23. The method of claim 22, wherein the parasitic capacitance around the first signal line, the second signal line, and the third signal line forms one node.

* * * * *